United States Patent
Lim et al.

(10) Patent No.: US 7,836,373 B2
(45) Date of Patent: Nov. 16, 2010

(54) METHOD AND APPARATUS FOR RECEIVING DATA IN A COMMUNICATION SYSTEM

(75) Inventors: Chi-Woo Lim, Suwon-si (KR); Gyu-Bum Kyung, Suwon-si (KR); Sung-Eun Park, Seoul (KR); Jae-Yoel Kim, Suwon-si (KR); Hong-Sil Jeong, Seoul (KR); Seung-Hoon Choi, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1030 days.

(21) Appl. No.: 11/603,377

(22) Filed: Nov. 21, 2006

(65) Prior Publication Data

US 2007/0118786 A1    May 24, 2007

(30) Foreign Application Priority Data

Nov. 21, 2005    (KR) ...................... 10-2005-0111358

(51) Int. Cl.
*H03M 13/45* (2006.01)
*H04L 1/16* (2006.01)

(52) U.S. Cl. ...................................... 714/751; 714/780

(58) Field of Classification Search ................ 714/751, 714/780
See application file for complete search history.

(56) References Cited

U.S. PATENT DOCUMENTS

| | | | |
|---|---|---|---|
| 6,741,581 B1* | 5/2004 | Sun et al. ..................... | 370/338 |
| 6,769,085 B2* | 7/2004 | Von Elbwart et al. ....... | 714/748 |
| 7,003,709 B2* | 2/2006 | Wengerter et al. .......... | 714/748 |
| 7,027,782 B2* | 4/2006 | Moon et al. ................. | 455/102 |
| 7,036,065 B2* | 4/2006 | Hessel et al. ................ | 714/746 |
| 7,072,307 B2* | 7/2006 | Tong et al. ................... | 370/253 |
| 7,076,718 B2* | 7/2006 | Miyoshi ...................... | 714/748 |
| 7,174,493 B2* | 2/2007 | Matsumoto et al. ......... | 714/748 |
| 7,236,740 B2* | 6/2007 | Koo et al. ................... | 455/13.4 |
| 2006/0251185 A1* | 11/2006 | Von Elbwart et al. ....... | 375/298 |
| 2008/0155148 A1* | 6/2008 | Oyman ....................... | 710/106 |
| 2008/0298387 A1* | 12/2008 | Lohr et al. .................. | 370/467 |

FOREIGN PATENT DOCUMENTS

KR    1020050041344    5/2005

\* cited by examiner

*Primary Examiner*—Stephen M Baker
(74) *Attorney, Agent, or Firm*—The Farrell Law Firm, LLP

(57) ABSTRACT

A method and apparatus is provided for receiving data in a receiver of a communication system. In the receiver, a first calculator calculates a Log Likelihood Ratio (LLR) value of data transmitted from a transmitter, a decoder performs iterative decoding on the transmitted data using the LLR value calculated by the first calculator. A second calculator determines whether there is an error in the decoded data by calculating an error of the data decoded by the decoder. A storage stores an LLR value of the decoded data according to the determination result of the second calculator. An adder adds up the LLR value calculated by the first calculator and the LLR value stored in the storage. A controller performs a control operation such that if the data transmitted from the transmitter is retransmitted data, the decoder performs iterative decoding using the LLR value added by the adder, and if the data transmitted from the transmitter is not retransmitted data, the decoder performs iterative decoding using the LLR value calculated by the first calculator.

12 Claims, 3 Drawing Sheets

METHOD AND APPARATUS FOR RECEIVING DATA IN A COMMUNICATION SYSTEM

PRIORITY

This application claims the benefit under 35 U.S.C. §119(a) of an application filed in the Korean Intellectual Property Office on Nov. 21, 2005 and assigned Serial No. 2005-111358, the contents of which are incorporated herein by reference.

BACKGROUND OF THE INVENTION

1. Field of the Invention

The present invention relates generally to a communication system, and in particular, to a method and apparatus for receiving data in a communication system using a Hybrid Automatic Repeat reQuest (HARQ) scheme.

2. Description of the Related Art

An error control scheme used in communication systems can be roughly divided into a Forward Error Correction (FEC) scheme and an Automatic Repeat reQuest (ARQ) scheme. FEC corrects errors in received data using codes having error correction capability, and is used when there is no feedback channel over which an Acknowledgement (ACK)/Non-Acknowledgement (NACK) message indicating success/failure in data transmission is to be transmitted to a transmitter. ARQ detects errors in received information using Cyclic Redundancy Check (CRC) codes having high error correction capability, and sends a retransmission request to a transmitter over a feedback channel upon detecting the errors. In FEC, if a receiver fails in error correction, erroneous data may be delivered to the user undesirably. Therefore, when a high-reliability system is realized with FEC, powerful codes capable of correcting a great number of errors are used, causing an increase in decoding complexity and thus making it difficult to realize the system. Compared with FEC, ARQ is low in complexity and high in reliability, but suffers from an abrupt decrease in information throughput as a channel error rate increases. To solve the problems of the above two schemes, the HARQ scheme has been proposed by combining ARQ and FEC.

HARQ can be classified into several schemes according to format of retransmission packets, a combining method of an exiting packet and a retransmitted packet, and presence/absence of the combining method. In other words, HARQ can be classified according to whether the retransmission packet is equal to the existing packet. Even if the retransmission packet is not equal to the existing packet, HARQ can be classified according to whether a part of the retransmission packet is equal to the existing packet. In addition, HARQ can be classified according to whether the retransmission packet is combined with the existing packet. The HARQ scheme generally combines the existing packet with the retransmitted packet, and decodes the combined packet. However, a HARQ scheme has not proposed yet having any detailed method of combining a defective packet with a retransmitted packet.

SUMMARY OF THE INVENTION

It is, therefore, an object of the present invention to provide a method and apparatus for receiving data in a communication system.

It is another object of the present invention to provide a method and apparatus for receiving data in a communication system using a HARQ scheme.

It is further another object of the present invention to provide a method and apparatus for receiving data in an HARQ system using codes requiring iterative decoding.

According to one aspect of the present invention, there is provided a method for receiving data in a receiver of a communication system. The method includes calculating a Log Likelihood Ratio (LLR) value of data transmitted from a transmitter; performing iterative decoding on the transmitted data using the calculated LLR value; calculating an error of the decoded data, and determining whether there is an error in the decoded data; storing an LLR value of the decoded data according to the determination result; adding the calculated LLR value and the stored LLR value; and performing iterative decoding using the added LLR value if the data transmitted from the transmitter is retransmitted data, and performing iterative decoding using the calculated LLR value if the data transmitted from the transmitter is not retransmitted data, thereby receiving the data transmitted the transmitter.

According to one aspect of the present invention, there is provided an apparatus for receiving data in a communication system. The apparatus includes a receiver having a first calculator for calculating a Log Likelihood Ratio (LLR) value of data transmitted from a transmitter; a decoder for performing iterative decoding on the transmitted data using the LLR value calculated by the first calculator; a second calculator for determining whether there is an error in the decoded data by calculating an error of the data decoded by the decoder; a storage for storing an LLR value of the decoded data according to the determination result of the second calculator; an adder for adding up the LLR value calculated by the first calculator and the LLR value stored in the storage; and a controller for performing a control operation such that if the data transmitted from the transmitter is retransmitted data, the decoder performs iterative decoding using the LLR value added by the adder, and if the data transmitted from the transmitter is not retransmitted data, the decoder performs iterative decoding using the LLR value calculated by the first calculator. The receiver receives the data transmitted from the transmitter through iterative decoding performed by the decoder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

The present invention will now be described in detail with reference to the annexed drawings. In the following description, a detailed description of known functions and configurations incorporated herein has been omitted for clarity and conciseness.

The present invention provides a method and apparatus for receiving data in a communication system using a Hybrid Automatic Repeat reQuest (HARQ) scheme ("HARQ communication system"). Although the present invention will be described with reference to a HARQ communication system by way of example, the data reception method and apparatus of the present invention can also be applied to other communication systems.

The present invention provides a method and apparatus for receiving data in an HARQ communication system using iterative decoding-required codes, for example, Low Density Parity Check (LDPC) codes. The present invention provides a data reception method and apparatus for improving decoding performance when combining a defective data packet with a retransmitted data packet in a process of decoding the iterative decoding-required codes in the case where a receiver, for example, a mobile station (MS), receives the data transmitted by a transmitter, for example a base station (BS).

Figure 1:
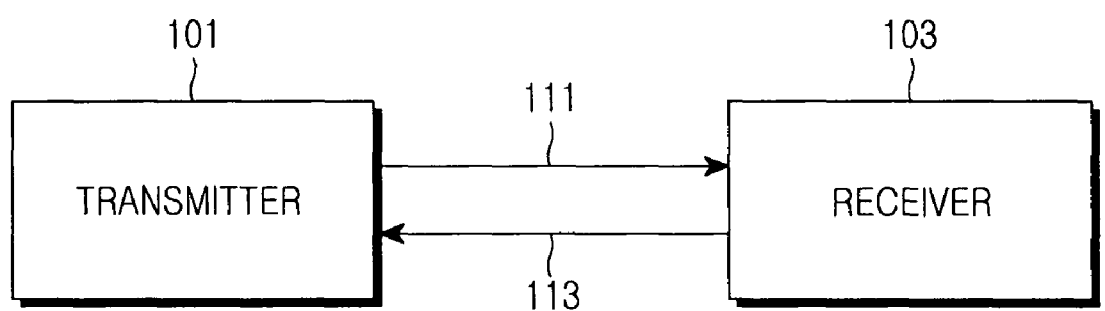
FIG. 1 is a diagram illustrating a signal flow between a transmitter and a receiver in an HARQ communication system according to the present invention.

FIG. 1 is a diagram illustrating a signal flow between a transmitter and a receiver in an HARQ communication system according to the present invention.

Referring to FIG. 1, the HARQ communication system includes a transmitter 101 and a receiver 103. A traffic channel 111 over which general data is transmitted, and a control channel 113, or feedback channel, for transmitting an Acknowledgement (ACK)/Non-Acknowledgement (NACK) message of the data transmitted over the traffic channel 111 are provided between the transmitter 101 and the receiver 103.

The transmitter 101 transmits a transmission data packet to the receiver 103 over the traffic channel 111, and the receiver 103 decodes the data packet transmitted from the transmitter 101 over the traffic channel 111. If the receiver 103 succeeds in decoding the transmitted data packet, it sends an ACK message to the transmitter 101 over the control channel 113. Upon receipt of the ACK message, the transmitter 101 transmits a new data packet to the receiver 103 over the traffic channel 111.

However, if the receiver 103 fails in decoding the transmitted data packet, it sends a NACK message to the transmitter 101 over the control channel 113. Upon receipt of the NACK message, the transmitter 101 retransmits the decoding-failed data packet so that the receiver 103 can successfully decode the defective data packet according to a predetermined scheme. The retransmission of the data packet is repeatedly performed until decoding of the data packet is performed without error, or repeatedly performed as many times as a maximum number of retransmissions, which is set according to communication environment or communication system. The receiver 103 combines the data packet transmitted before occurrence of the error, with the data packet retransmitted in response to the retransmission request, and then decodes the combined data packet.

When the receiver 103 of the HARQ communication system decodes iterative decoding-required codes, the receiver 103 calculates a Log Likelihood Ratio (LLR) value of the data packet received from the transmitter 101, and then inputs the calculated LLR value to a decoder. The input LLR value is updated in an iterative decoding process of the receiver 103, and the receiver 103 determines a bit value using the update-completed LLR value. In the method of updating the LLR value in the iterative decoding process and then determining a bit value using the update-completed LLR value, even though an error occurs in the data packet decoded with the iterative decoding-required codes like the LDPC codes, the bit error rate decreases after the decoding. Therefore, in terms of the reception performance of the data packet, it is preferable to combine an LLR value after decoding the defective data packet with an LLR value of the retransmitted data packet and then decode the combined LLR value. This method can improve performance without affecting complexity of the decoder.

Figure 2:
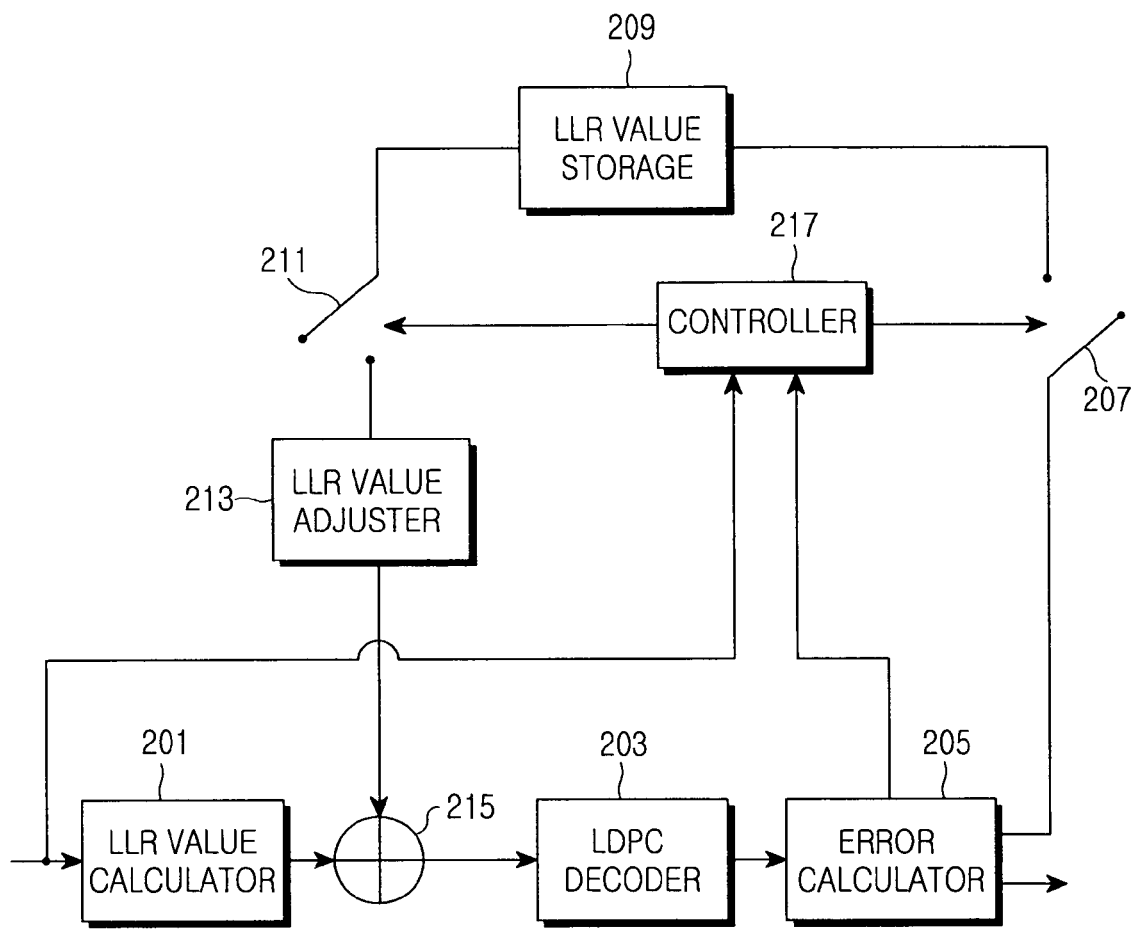
FIG. 2 is a diagram illustrating a structure of a receiver in a communication system according to the present invention.

As the iterative decoding is performed in this way, the bit error rate decreases after the data packet is decoded. However, even though the number of defective bits decreases, an LLR value of the defective bits can change to a value that can be hardly restored. If this LLR value is combined with an LLR value of the retransmitted data packet, the defective bits occurring after the decoding of the combined LLR value can be hardly recovered. Therefore, in the HARQ communication system according to the present invention, when combining the LLR value updated through iterative decoding with the LLR value of the retransmitted data packet, the receiver 103 adjusts the LLR value updated through the iterative decoding, and then combines the adjusted LLR value with the LLR value of the retransmitted data packet. With reference to FIG. 2, a detailed description will now be made of a structure of the receiver in the communication system according to the present invention.

FIG. 2 is a diagram illustrating a structure of a receiver in a communication system according to the present invention.

Referring to FIG. 2, the receiver includes an LLR value calculator 201, a decoder 203, a data packet error calculator 205, an LLR value storage 209, an LLR value adjuster 213, a controller 217, an adder 215, a first switch 207, and a second switch 211.

The LLR value calculator 201 calculates an LLR value of a data packet received from a transmitter, and provides the calculated LLR value to the decoder 203 through adder 215. The decoder 203 performs iterative decoding using the LLR value received from the LLR value calculator 201, and updates the LLR value through the iterative decoding.

The LLR value update-completed through iterative decoding by the decoder 203 and the decoded data packet are input to the data packet error calculator 205, and the data packet error calculator 205 calculates an error of the decoded data packet using the LLR value update-completed through iterative decoding, and then determines whether there is any error in the data packet decoded by the decoder 203. If it is determined that there is no error in the data packet, the receiver sends an ACK message to the transmitter, considering that it has successfully decoded the data packet transmitted from the transmitter. Upon receipt of the ACK message, the transmitter then transmits a new data packet to the receiver, and the receiver receives the new data packet and performs thereon the foregoing operation. Information on the presence/absence of an error in the data packet, detected by the data packet error calculator 205, is delivered to the controller 217. Based on the information on the presence/absence of an error in the data packet, the controller 217 controls the receiver to transmit an ACK message to the transmitter.

If it is determined by the data packet error calculator 205 that there is an error in the data packet, the receiver transmits a NACK message to the transmitter under the control of the controller 217, considering that it has failed in decoding the data packet transmitted from the transmitter. Upon receipt of the NACK message, the transmitter retransmits the defective data packet. Subsequently, the controller 217 controls the first switch 207 so that the data packet error calculator 205 provides the update-completed LLR value to the LLR value storage 209.

Upon receipt of the data packet retransmitted from the transmitter, the controller 217 controls the second switch 211 so as to provide the LLR value update-completed through the iterative decoding on the defective data packet stored in the LLR value storage 209, to the LLR value adjuster 213. That is, upon receipt of the data packet from the transmitter, the controller 217 determines whether the transmitted data packet is an initially transmitted data packet or a data packet retransmitted due to an error occurring after decoding on the previously transmitted data packet. If it is determined that the transmitted data packet is a data packet retransmitted due to an error occurring after decoding on the previously transmitted data packet, the controller 217 controls the second switch 211 so as to provide the LLR value update-completed through decoding on the defective data packet stored in the LLR value storage 209, to the LLR value adjuster 213.

Then the LLR value adjuster 213 adjusts the LLR value update-completed through the iterative decoding on the defective data packet provided from the LLR value storage 209, and provides the adjusted LLR value to the adder 215. The adder 215 adds the LLR value adjusted by the LLR value adjuster 213, i.e. the LLR value obtained by adjusting the LLR value update-completed through the iterative decoding on the defective data packet, and the LLR value calculated by the LLR value calculator 201 for the data packet retransmitted for the defective data packet. The LLR value added by the adder 215 is provided to the decoder 203, and the decoder 203 receiving the added LLR value performs iterative decoding using the added LLR value and updates the added LLR value through the iterative decoding. The LLR value update-completed through the iterative decoding by the decoder 203 and the decoded data packet are input to the data packet error calculator 205, and the data packet error calculator 205 calculates an error of the decoded data packet using the LLR value update-completed through iterative decoding, and then determines whether there is an error in the data packet decoded by the decoder 203. The process of determining the presence/absence of an error in the iterative-decoded and decoded data packet is repeated until the data packet error calculator 205 detects the absence of an error in the decoded data packet, or until retransmission of the defective data packet is performed as many times as a pre-set maximum number of retransmissions, which is set according to the communication environment or communication system.

A detailed description will now be made of a method in which the LLR value adjuster 213 adjusts the LLR value, which is stored in the LLR value storage 209 after being update-completed through iterative decoding on the defective data packet.

If the LLR value update-completed through iterative decoding on the defective data packet is denoted by $l_1$, the LLR value update-completed through iterative decoding on the data packet retransmitted for the defective data packet is denoted by $l_2$, and the LLR value provided to the decoder 203 after the LLR value obtained by adjusting $l_1$ by the LLR value adjuster 213 and $l_2$ are added by the adder 215 is denoted by l, then l can be defined as Equation (1):

$$l = l_2 + p \times l_1 \pm q, \ 0 \leq p, \ q \leq 1 \quad (1)$$

In Equation (1), $p \times l_1 \pm q$ denotes an LLR value obtained by adjusting $l_1$ by the LLR value adjuster 213, and l denotes a value obtained by adding up $l_2$ and $p \times l_1 \pm q$ by the adder 215.

Here, values of p and q are not an arbitrary value between 0 and 1, and are set according to the communication environment and communication system. In other words, as to the values of p and q, the LLR value update-completed through iterative decoding on the defective data packet may increase in level as compared with the LLR value before the iterative decoding, and if the increased LLR value is combined with the LLR value of the retransmitted data packet, it is difficult to restore the defective bits as described above. Therefore, the values of p and q can be set such that a particular value having excellent performance is experimentally derived according to the communication environment and communication system, or a variance of the LLR value updated through iterative decoding is calculated, and the variance value should have a value similar to that of the LLR value before the iterative decoding. Although the values of p and q can be differently set for each individual data packet, it is preferable to use the values of p and q, which are equally set for each individual data packet using the foregoing method, thereby preventing influence on the complexity of the communication system.

Figure 3:
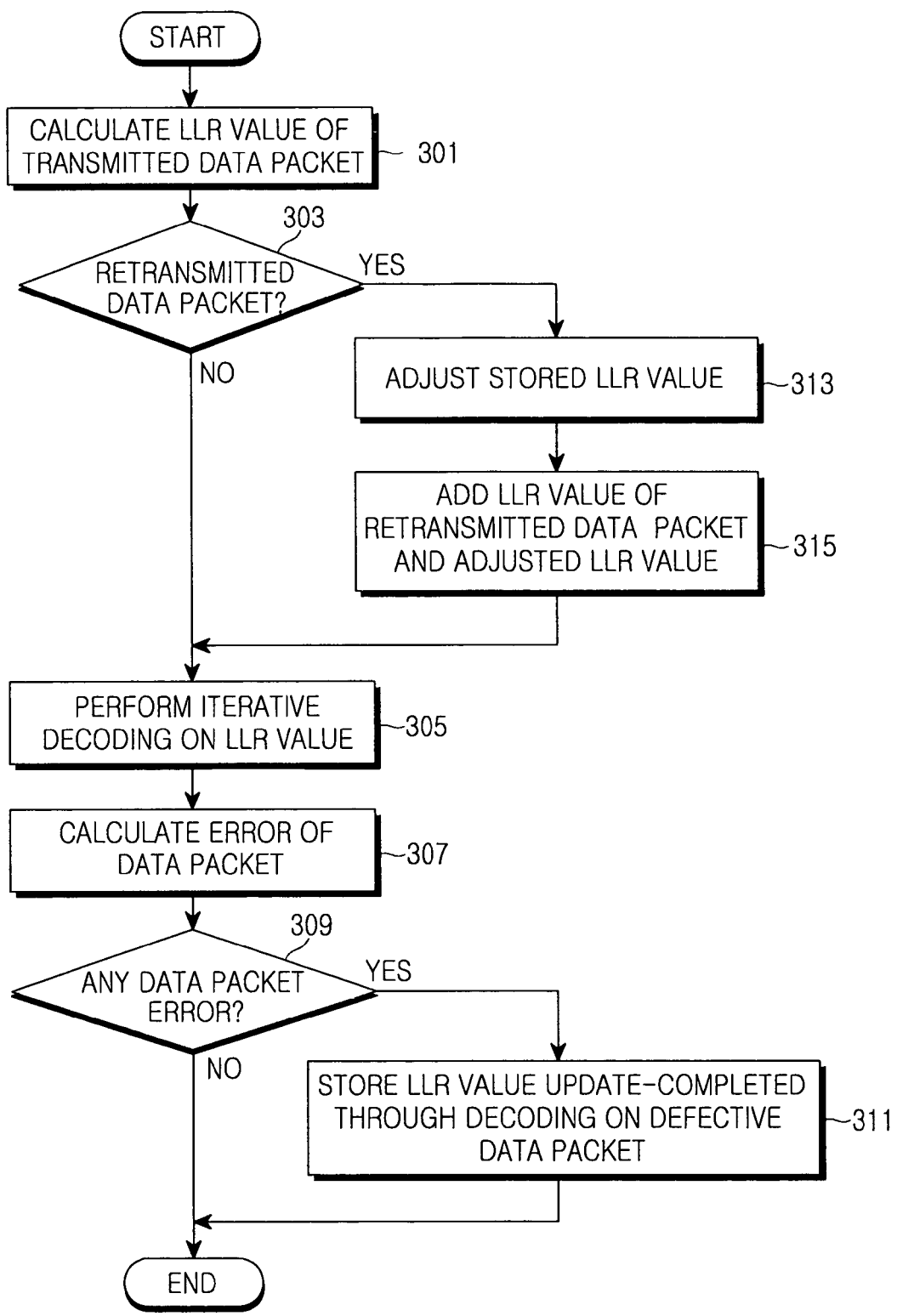
FIG. 3 is a diagram illustrating an operation of a receiver in a communication system according to the present invention.

FIG. 3 is a diagram illustrating an operation of a receiver in a communication system according to the present invention.

Referring to FIG. 3, in step 301, if a data packet is transmitted from a transmitter, an LLR value calculator 201 of the receiver calculates an LLR value of the transmitted data packet. Thereafter, a controller 217 of the receiver determines in step 303 whether the transmitted data packet is a retransmitted data packet. If it is determined in step 303 that the transmitted data packet is not a retransmitted data packet, an adder 215 of the receiver provides only the LLR value calculated in step 301 by the LLR value calculator 201 to a decoder 203.

Thereafter, in step 305, the decoder 203 of the receiver decodes the data packet transmitted in step 301 using the provided LLR value through iterative decoding. After the decoder 203 completes update of the LLR value through iterative decoding on the transmitted data packet, a data packet error calculator 205 of the receiver calculates an error of the update-completed data packet in step 307. Thereafter, the data packet error calculator 205 determines in step 309 whether there is any error in the data packet depending on the error calculation result on the data packet. If it is determined in step 309 that there is no error in the data packet, the receiver sends an ACK message to the transmitter as described above, and terminates the process. However, if it is determined in step 309 that there is an error in the data packet, an LLR value storage 209 of the receiver, under the control of the controller 217, stores the LLR value update-completed through decoding on the data packet in step 311. Further, the receiver transmits a NACK message to the transmitter as described above, and terminates the process.

When the transmitter retransmits the data packet as the receiver fails in decoding the data packet transmitted from the transmitter due to an error in the data packet decoded in step 305, the receiver calculates an LLR value of the retransmitted data packet in step 301. Here, because it is determined in step 303 that the packet data transmitted in step 301 is a retransmitted data packet, the receiver proceeds to step 313. In this case, because the data packet was retransmitted from the transmitter due to the failure in decoding the previously transmitted data packet in step 305, the controller 217 controls a second switch 211 in step 313 so that the LLR value update-completed through decoding on the defective data packet stored in the LLR value storage 209 is delivered to an LLR value adjuster 213 of the receiver. The LLR value adjuster 213 adjusts the LLR value stored in the LLR value storage 209, i.e. the LLR value update-completed through decoding on the defective data packet. Herein, the LLR value adjuster 213 adjusts the LLR value using Equation (1), and then provides the adjusted LLR value to the adder 215. In step 315, the adder 215 adds up the LLR value adjusted in step 313 by the LLR value adjuster 213, i.e. the LLR value obtained by adjusting the LLR value update-completed through decoding on the defective data packet, and the LLR value calculated by the LLR value calculator 201 for the data packet retransmitted for the defective data packet, and provides the added LLR value to the decoder 203. Thereafter, in step 305, the decoder 203 performs iterative decoding on the retransmitted data packet using the LLR value added in step 315. After the decoder 203 completes the update of the added LLR value through iterative decoding on the retransmitted data packet, the data packet error calculator 205 calculates an error of the update-completed data packet in step 307, and determines in step 309 whether there is any error in the data packet.

The operation of the receiver according to the present invention is repeated until it is determined in step 309 that there is no error in the data packet, or until retransmission of the defective data packet is performed as many times as a maximum number of retransmissions, which is previously set according to the communication environment or communication system.

As can be understood from the foregoing description, in the HARQ communication system using iterative decoding-required codes, in combining an LLR value updated through iterative decoding with an LLR value of the retransmitted data packet, the present invention adjusts the LLR value updated through the iterative decoding, combines the adjusted LLR value with the LLR value of the retransmitted LLR value, and decodes the data packet using the combined LLR value, thereby improving decoding and reception performance of the transmitted data packet. In addition, the present invention reduces the number of retransmissions for the data packet, contributing to improved performance of the communication system.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for receiving data in a communication system, comprising:
    a receiver including
    a first calculator for calculating a Log Likelihood Ratio (LLR) value of data transmitted from a transmitter;
    a decoder for performing iterative decoding on the transmitted data using the LLR value calculated by the first calculator;
    a second calculator for determining whether there is an error in the decoded data by calculating an error of the data decoded by the decoder;
    a storage for storing an LLR value of the decoded data according to the determination result of the second calculator;
    an adder for adding the LLR value calculated by the first calculator and the LLR value stored in the storage; and
    a controller for performing a control operation such that if the data transmitted from the transmitter is retransmitted data, the decoder performs iterative decoding using the LLR value added by the adder, and if the data transmitted from the transmitter is not retransmitted data, the decoder performs iterative decoding using the LLR value calculated by the first calculator;
    wherein the receiver receives the data transmitted from the transmitter through iterative decoding performed by the decoder.

2. The apparatus of claim 1, wherein the transmitter transmits data to the receiver using iterative decoding-required codes, and the communication system is a Hybrid Automatic Repeat reQuest (HARQ) scheme communication system.

3. The apparatus of claim 1, further comprising an adjuster for adjusting the LLR value stored in the storage if the data transmitted from the transmitter is retransmitted data, wherein the adder adds the LLR value adjusted by the adjuster and the LLR value calculated by the first calculator.

4. The apparatus of claim 3, wherein the controller performs a control operation such that if there is an error in the decoded data, the LLR value of the decoded data is stored in the storage.

5. The apparatus of claim 1, wherein the decoder updates the LLR value of the decoded data through iterative decoding on the transmitted data.

6. The apparatus of claim 5, wherein the second calculator calculates an error of the data decoded by the decoder using the LLR value updated by the decoder, and determines whether there is an error in the decoded data.

7. A method for receiving data in a receiver of a communication system, comprising the steps of:
    calculating a Log Likelihood Ratio (LLR) value of data transmitted from a transmitter;
    performing iterative decoding on the transmitted data using the calculated LLR value;
    calculating an error of the decoded data, and determining whether there is an error in the decoded data;
    storing an LLR value of the decoded data according to the determination result;
    and
    performing iterative decoding using an added LLR value formed by adding the calculated LLR value and the stored LLR value if the data transmitted from the transmitter is retransmitted data, and performing iterative decoding using the calculated LLR value if the data transmitted from the transmitter is not retransmitted data, thereby receiving the data transmitted the transmitter.

8. The method of claim 7, wherein the transmitter transmits data to the receiver using iterative decoding-required codes, and the communication system is a Hybrid Automatic Repeat reQuest (HARQ) scheme communication system.

9. The method of claim 7, wherein adding the calculated LLR value and the stored LLR value includes adjusting the stored LLR value if the data transmitted from the transmitter is retransmitted data, and adding the adjusted LLR value and the calculated LLR value.

10. The method of claim 9, wherein storing the LLR value storing of the decoded data comprises storing the LLR value of the decoded data if there is an error in the decoded data.

11. The method of claim 7, wherein performing iterative decoding comprises updating the LLR value of the decoded data through iterative decoding on the transmitted data.

12. The method of claim 11, wherein calculating the error of the decoded data comprises calculating an error of the decoded data using the updated LLR value, and determining whether there is an error in the decoded data.

* * * * *